United States Patent
Yang (10) Patent No.: US 11,869,576 B2
(45) Date of Patent: Jan. 9, 2024

(54) WORD LINE DRIVING CIRCUIT AND DYNAMIC RANDOM ACCESS MEMORY

(71) Applicant: CHANGXIN MEMORY TECHNOLOGIES, INC., Hefei (CN)

(72) Inventor: Cheng-Jer Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 198 days.

(21) Appl. No.: 17/651,796

(22) Filed: Feb. 19, 2022

(65) Prior Publication Data

US 2022/0310152 A1    Sep. 29, 2022

Related U.S. Application Data

(63) Continuation of application No. PCT/CN2021/120391, filed on Sep. 24, 2021.

(30) Foreign Application Priority Data

Mar. 24, 2021    (CN) .......................... 202110314168.X (51) Int. Cl.
*G11C 11/40*    (2006.01)
*G11C 11/408*    (2006.01)
*G11C 11/4074*    (2006.01)

(52) U.S. Cl.
CPC ...... *G11C 11/4085* (2013.01); *G11C 11/4074* (2013.01)

(58) Field of Classification Search
None
See application file for complete search history.

(56) References Cited

U.S. PATENT DOCUMENTS

| | | | | |
|---|---|---|---|---|
| 5,557,580 | A | * | 9/1996 | Numaga .................. G11C 8/08 365/189.11 |
| 5,917,766 | A | * | 6/1999 | Tsuji ...................... G11C 29/34 365/189.11 |
| 7,561,488 | B2 | | 7/2009 | Lee |
| 7,646,653 | B2 | | 1/2010 | Choi |

(Continued)

FOREIGN PATENT DOCUMENTS

| | | |
|---|---|---|
| CN | 101119113 A | 2/2008 |
| CN | 101572120 A | 11/2009 |

(Continued)

*Primary Examiner* — Tan T. Nguyen
(74) *Attorney, Agent, or Firm* — Syncoda LLC; Feng Ma (57) ABSTRACT

A word line driving circuit includes a driving circuit and a control circuit. The control circuit includes a control sub-circuit, a first switching sub-circuit and a second switching sub-circuit. The first switching sub-circuit is provided with: a control terminal electrically connected with the control sub-circuit, a first terminal electrically connected with a first power supply voltage, and a second terminal electrically connected with a third input terminal of the driving circuit. The second switching sub-circuit is provided with: a control terminal electrically connected with the control sub-circuit, a first terminal electrically connected with a second power supply voltage, and a second terminal electrically connected with the third input terminal of the driving circuit. The second power supply voltage is greater than a ground voltage.

20 Claims, 4 Drawing Sheets

(56) References Cited

U.S. PATENT DOCUMENTS

| | | | |
|---|---|---|---|
| 2003/0039143 A1* | 2/2003 | Ogane | G11C 16/08 |
| | | | 365/185.23 |
| 2008/0031060 A1 | 2/2008 | Choi | |
| 2014/0140125 A1* | 5/2014 | Mae | G11C 13/0069 |
| | | | 365/148 |
| 2021/0057017 A1 | 2/2021 | Liu | |

FOREIGN PATENT DOCUMENTS

| | | |
|---|---|---|
| CN | 112349320 A | 2/2021 |
| KR | 101559909 B1 | 10/2015 |

\* cited by examiner

WORD LINE DRIVING CIRCUIT AND DYNAMIC RANDOM ACCESS MEMORY

CROSS-REFERENCE TO RELATED APPLICATIONS

This is a continuation of International Patent Application No. PCT/CN2021/120391 filed on Sep. 24, 2021, which claims priority to Chinese Patent Application No. 202110314168.X filed on Mar. 24, 2021. The disclosures of the above-referenced applications are hereby incorporated by reference in their entirety.

BACKGROUND

A word line driving circuit of a dynamic random access memory includes multiple inverters, a P-type driving transistor, a first N-type driving transistor and a second N-type driving transistor. A gate of the P-type driving transistor and a gate of the first N-type driving transistor are electrically connected with an external control signal.

SUMMARY

The present disclosure relates to but is not limited to a word line driving circuit and a dynamic random access memory.

The present disclosure provides a word line driving circuit, which includes a driving circuit and a control circuit.

The driving circuit is provided with a first input terminal, a second input terminal, a third input terminal and an output terminal. The first input terminal is configured to receive a first external driving signal, the second input terminal is configured to receive a second external driving signal, and the output terminal is configured to output a word line driving signal.

The control circuit includes a control sub-circuit, a first switching sub-circuit and a second switching sub-circuit.

The first switching sub-circuit is provided with a control terminal, a first terminal and a second terminal. The control terminal of the first switching sub-circuit is electrically connected with the control sub-circuit, the first terminal of the first switching sub-circuit is electrically connected with a first power supply voltage, and the second terminal of the first switching sub-circuit is electrically connected with the third input terminal of the driving circuit. The second switching sub-circuit is provided with a control terminal, a first terminal and a second terminal. The control terminal of the second switching sub-circuit is electrically connected with the control sub-circuit, the first terminal of the second switching sub-circuit is electrically connected with a second power supply voltage, and the second terminal of the second switching sub-circuit is electrically connected with the third input terminal of the driving circuit. The second power supply voltage is greater than a ground voltage.

The present disclosure also provides a dynamic random access memory including the above word line driving circuit.

DETAILED DESCRIPTION

In order to facilitate understanding of the present disclosure, the present disclosure will be described in more detail below with reference to accompanying drawings. Preferred embodiments of the present disclosure are illustrated in the accompanying drawings. However, the present disclosure may be implemented in many different forms, and is not limited to the embodiments described herein. Rather, these embodiments are provided for the purpose of making the disclosure of the present disclosure more thorough and comprehensive.

Unless otherwise defined, all technical and scientific terms used herein have the same meanings as generally understood by those skilled in the art of the present disclosure. The terms used herein in the specification of the present disclosure are for the purpose of describing specific embodiments only and are not intended to limit the present disclosure.

It is to be understood that the terms such as "first" and "second" used in the present disclosure may be used herein for describing various elements, but are not used for limiting these elements. These terms are only for distinguishing the first element from another element. For example, a first input terminal may be referred to as a second input terminal without departing from the scope of the present disclosure, and similarly, a second input terminal may be referred to as a first input terminal. Both the first input terminal and the second input terminal are input terminals, but are not a same input terminal.

It can be understood that "connection" in the following embodiments should be understood as "electrical connection," "communication connection" and the like, as long as there are transmission of electrical signals or data between connected circuits, modules, units, etc.

It is to be noted that in the following embodiments, the high potential and the low potential are relative concepts (that is, a voltage value of the high potential is higher than a voltage value of the low potential corresponding to the high potential), and the specific voltage value of the high potential and the specific voltage value of the low potential are not limited herein. In addition, it is not limited that the high potentials applied to different signal lines in the specific embodiments are equal, and it is not limited that the high potentials applied to a specific signal line in different states are equal. Those skilled in the art would understand that the high potential and low potential values may be set according to process nodes, speed requirements, reliability requirements, etc.

An external signal is input to the word line driving circuit through an input terminal of a first inverter A1, a signal PXID is output by an output terminal of a second inverter A2, and a source of the P-type driving transistor receives the signal PXID. Another external signal is input to the word line driving circuit through an input terminal of a third inverter A3, a signal PXIB is output by an output terminal of the third inverter A3 and is received by a gate of the second N-type driving transistor.

In an active mode, the external control signal electrically connected with the gate of the P-type driving transistor and the gate of the first N-type driving transistor is controlled to be at a low potential, the signal PXID is controlled by an external signal to be at a high potential through the first inverter A1 and the second inverter A2, the signal PXIB is controlled by another external signal to be at a low potential through the third inverter A3. Then the P-type driving transistor is turned on, the first N-type driving transistor and the second N-type driving transistor are turned off, a signal output terminal is output as a high potential, and the corresponding word line is turned on.

Figure 1:
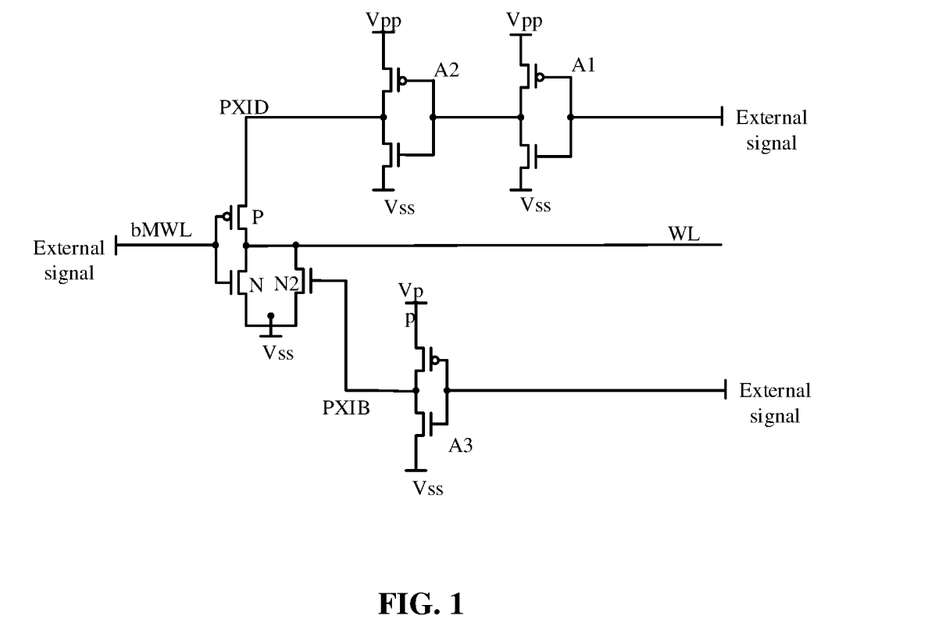
FIG. 1 illustrates a circuit diagram of a word line driving circuit in some implementations.

FIG. 1 illustrates a word line driving circuit of a dynamic random access memory in some implementations. The word line driving circuit includes a first inverter A1, a second inverter A2, a third inverter A3, a P-type driving transistor P, a first N-type driving transistor N and a second N-type driving transistor N2. A gate of the P-type driving transistor P and a gate of the first N-type driving transistor N are electrically connected with an external control signal bMWL.

An input terminal of the first inverter A1 is electrically connected with an external circuit, an input terminal of the second inverter A2 is electrically connected with an output terminal of the first inverter A1, an input terminal of the third inverter A3 is electrically connected with an external circuit, an output terminal of the third inverter A3 is electrically connected with a gate of the second N-type driving transistor N2. A source of the P-type driving transistor P is electrically connected with an output terminal of the second inverter A2, a drain of the P-type driving transistor P and a drain of the first N-type driving transistor N are electrically connected with a signal output terminal WL. A drain of the second N-type driving transistor N2 is electrically connected with the signal output terminal WL, and a source of the first N-type driving transistor N and a source of the second N-type driving transistor N2 are electrically connected with a ground voltage Vss.

An external signal is input to the word line driving circuit through the input terminal of the first inverter A1, a signal PXID is output by the output terminal of the second inverter A2, and the source of the P-type driving transistor receives the signal PXID. Another external signal is input to the word line driving circuit through the input terminal of the third inverter A3, a signal PXIB is output by the output terminal of the third inverter A3 and is received by a gate of the second N-type driving transistor N2.

In an active mode, the external control signal bMWL electrically connected with the gate of the P-type driving transistor P and the gate of the first N-type driving transistor N is controlled to be at a low potential, the signal PXID is controlled by an external signal to be at a high potential through the first inverter A1 and the second inverter A2, the signal PXIB is controlled by another external signal to be at a low potential through the third inverter A3. Then the P-type driving transistor P is turned on, the first N-type driving transistor N and the second N-type driving transistor N2 are turned off, the signal output terminal WL is output as a high potential, and the corresponding word line is turned on.

However, when the circuit is in a standby mode, the external control signal bMWL electrically connected with the gate of the P-type driving transistor P and the gate of the first N-type driving transistor N is controlled to be at a high potential, the signal PXID is controlled by an external signal to be at a low potential through the first inverter A1 and the second inverter A2, and the signal PXIB is controlled by another external signal to be at a high potential through the third inverter A3. Then the first N-type driving transistor N and the second N-type driving transistor N2 are turned on, the P-type driving transistor P is turned off, the signal output terminal WL is output as a low potential, and the corresponding word line is turned off. In this mode, a source voltage and a drain voltage of the P-type driving transistor P are the ground voltage Vss, and a gate voltage is a high potential required for turning on the word line. As a result, a large voltage difference is formed between the gate and the drain of the P-type driving transistor P and between the gate and the source of the P-type driving transistor P. In the region where the gate and the drain of the Complementary Metal-Oxide-Semiconductor (CMOS) field effect transistor are overlapped, a gate-induced drain leakage current (GIDL) may be easily generated in a channel between drain surface bands due to electron-hole pairs generated by a high electric field in a depletion region. Therefore, not only chip power consumption is increased, but also service lives of the transistors are affected.

An improved word line driving circuit is expected. Embodiments of a word line driving circuit and a dynamic random access memory provided in the present disclosure will be described in detail below with reference to the accompanying drawings. The electrical connection described herein includes direct connection, connection through a transistor, and other equivalent connection manners.

Figure 2:
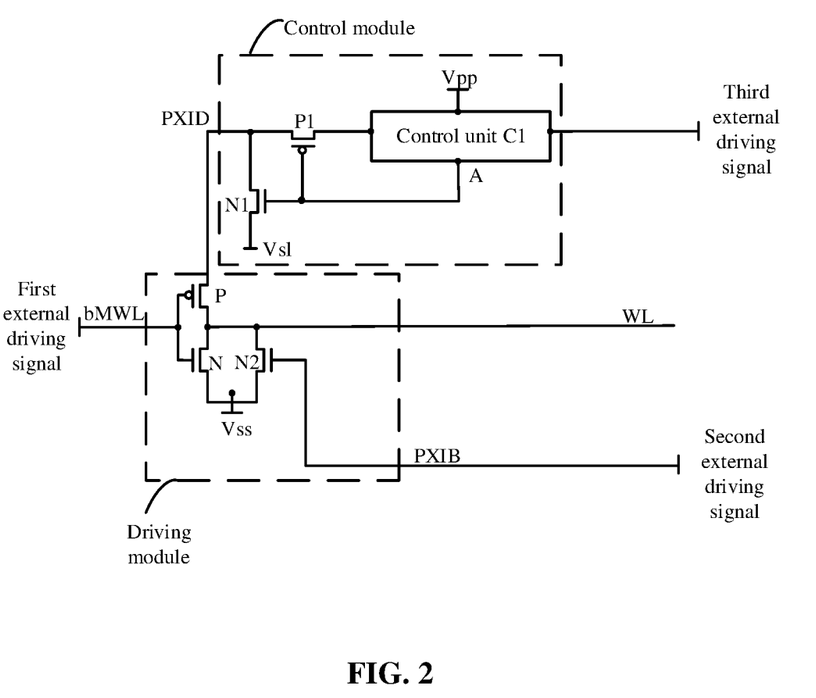
FIG. 2 illustrates a circuit diagram of a word line driving circuit according to a first embodiment of the present disclosure.

FIG. 2 illustrates a circuit diagram of a word line driving circuit according to a first embodiment of the present disclosure. Reference is made to FIG. 2, in which the word line driving circuit includes a driving module and a control module.

The driving module is provided with a first input terminal bMWL, a second input terminal PXIB, a third input terminal PXID and an output terminal WL. The first input terminal bMWL is configured to receive a first external driving signal, the second input terminal PXIB is configured to receive a second external driving signal, and the output terminal WL is configured to output a word line driving signal.

The control module includes a control unit C1, a first switching unit P1 and a second switching unit N1.

The control unit C1 may receive a third external driving signal.

The first switching unit P1 is provided with a control terminal, a first terminal and a second terminal. The control terminal is electrically connected with the control unit C1 at a point A, the first terminal is electrically connected with a first power supply voltage Vpp, and the second terminal is electrically connected with the third input terminal PXID of the driving module. In the embodiment, the control unit C1 is electrically connected with the first power supply voltage Vpp, and the first terminal of the first switching unit P1 is electrically connected with the first power supply voltage Vpp through the control unit C1. In other embodiments of the present disclosure, the first terminal of the first switching unit P1 may also be electrically connected directly with the first power supply voltage Vpp.

The second switching unit N1 is provided with a control terminal, a first terminal and a second terminal. The control terminal is electrically connected with the control unit C1 at the point A, the first terminal is electrically connected with a second power supply voltage Vs1, and the second terminal is electrically connected with the third input terminal PXID of the driving module. The second power supply voltage Vs1 is greater than a ground voltage Vss.

When the word line driving circuit is in a standby mode, the control unit C1 is configured to receive a third external driving signal, to control the first switching unit P1 to be turned off and the second switching unit N1 to be turned on according to the third external signal, to enable the third input terminal PXID of the driving module to receive the second power supply voltage Vs1.

When the word line driving circuit is in an active mode, the control unit C1 is configure to receive a third external driving signal, to control the first switching unit P1 to be turned on and the second switching unit N1 to be turn off according to the third external signal, to enable the third input terminal PXID of the driving module to receive the first power supply voltage Vpp.

The word line driving circuit of the present disclosure is provided with a control module including a first switching unit and a second switching unit at a third input terminal of a driving module. Therefore, when the word line driving circuit is in a standby mode, the third input terminal of the driving module is electrically connected with the second power supply voltage, and the second power supply voltage is greater than a ground voltage, in such way, the voltage at the third input terminal of the driving module is pulled up. Accordingly, a voltage difference between a gate and a source of a P-type driving transistor P of the driving module is reduced, a GIDL can also be reduced, and static power consumption of the driving module in the standby mode can be reduced, further, service lives of components in the circuit can be prolonged.

Furthermore, the first switching unit P1 is a P-type Metal-Oxide-Semiconductor (PMOS) transistor, and the second switching unit N1 is an N-type Metal-Oxide-Semiconductor (NMOS) transistor. When the word line driving circuit is in the standby mode, the point A is controlled by the control unit C1 to be at a high potential, the first switching unit P1 is turned off, and the second switching unit N1 is turned on, to enable the third input terminal PXID of the driving module to receive the second power supply voltage Vs1. Then, the voltage of the third input terminal PXID of the driving module is pulled up, the voltage difference between the gate and the source of the P-type driving transistor P of the driving module is reduced. Therefore, the GIDL can be reduced, and the static power consumption of the driving module in the standby mode can be reduced. When the word line driving circuit is in the active mode, the point A is controlled by the control unit C to be at a low potential, the first switching unit P1 is turned on, and the second switching unit N1 is turned off, to enable the third input terminal PXID of the driving module to receive the first power supply voltage Vpp.

Moreover, the second power supply voltage Vs1 is smaller than a threshold voltage of the second switching unit N1. In the embodiment, the second power supply voltage Vs1 is a source power supply voltage having a value in a range of 0.2 V to 0.5 V.

In addition, the driving module includes a P-type driving transistor P, an N-type driving transistor N and a second NMOS transistor N2.

The P-type driving transistor P is provided with a control terminal, a first terminal and a second terminal. The control terminal is electrically connected with a first input terminal bMWL of the driving module, the first terminal is electrically connected with the third input terminal PXID of the driving module, and the second terminal is electrically connected with the output terminal WL of the driving module.

The N-type driving transistor N is provided with a control terminal, a first terminal and a second terminal. The control terminal is electrically connected with the first input terminal bMWL of the driving module, the first terminal is electrically connected with the output terminal WL of the driving module, and the second terminal is electrically connected with a ground terminal Vss.

The second NMOS transistor N2 is provided with a control terminal, a first terminal and a second terminal. The control terminal is electrically connected with a second input terminal PXIB of the driving module, the first terminal is electrically connected with the output terminal WL of the driving module, and the second terminal is electrically connected with the ground terminal Vss.

When the word line driving circuit is in a standby mode, the first external driving signal provides a high potential, the P-type driving transistor P is turned off, and the N-type driving transistor N is turned on, to enable the output terminal WL to be electrically connected with the ground terminal Vss. Moreover, the second external driving signal provides a high potential, the second NMOS transistor N2 is turned on, to further enable the output terminal WL to be electrically connected with the ground terminal Vss, then a word line driving signal with a low potential is output and the corresponding word line is turned off. Meanwhile, the control unit C1 receives a third external driving signal and controls the first switching unit P1 to be turned off and the second switching unit N1 to be turned on according to the third external driving signal, to enable the first terminal of the P-type driving transistor P to receive the second power supply voltage Vs1. In such way, a voltage difference between a gate and a source of the P-type driving transistor P is reduced, a GIDL caused by the gate-source voltage difference of the P-type driving transistor P in the word line driving circuit can be reduced. Therefore, static power consumption of the P-type driving transistor P in a standby mode can be reduced and service lives of components in the circuit can be prolonged.

When the word line driving circuit is in an active mode, the first external driving signal provides a low potential, the P-type driving transistor P is turned on, and the N-type driving transistor N is turned off, to enable the output terminal WL to be electrically connected with the first terminal of the P-type driving transistor P. The second external driving signal provides a low potential and the second NMOS transistor N2 is turned off, to prevent the output terminal WL from being electrically connected with the ground terminal Vss. Meanwhile, the control unit C1 receives a third external driving signal and controls the first switching unit P1 to be turned on and the second switching unit N1 to be turned off according to the third external signal. Then the first terminal of the P-type driving transistor P receives the first power supply voltage Vpp, to enable the output terminal WL to be electrically connected with the first power supply voltage Vpp, then a word line driving signal with a high potential is output, and the word line is driven.

Figure 3:
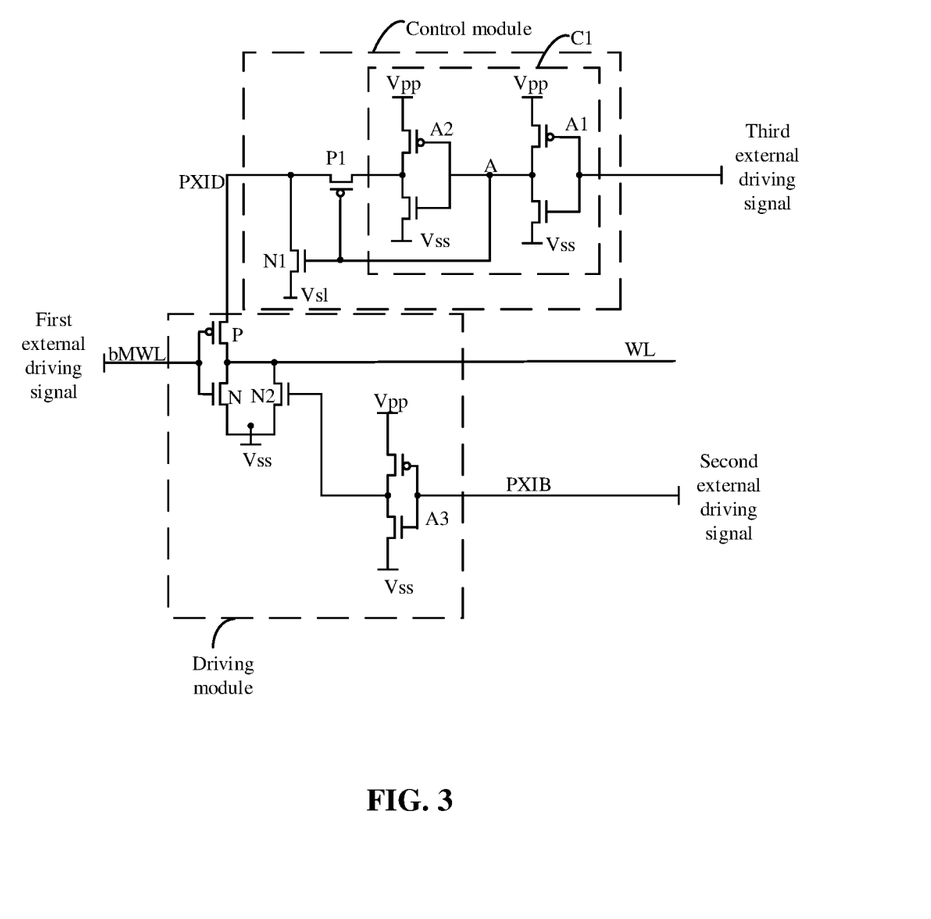
FIG. 3 illustrates a circuit diagram of a word line driving circuit according to a second embodiment of the present disclosure.

The present disclosure also provides a second embodiment, which differs from the first embodiment in that an implementation of the control unit is provided in the second embodiment. Reference is made to FIG. 3, FIG. 3 illustrates a circuit diagram of a word line driving circuit according to a second embodiment of the present disclosure.

The word line driving circuit includes a driving module and a control module.

The driving module is provided with a first input terminal bMWL, a second input terminal PXIB and an output terminal WL. The first input terminal bMWL is configured to receive a first external driving signal, the second input terminal PXIB is configured to receive a second external driving signal, and the output terminal WL is configured to output a word line driving signal.

The control module includes a control unit C1, a first switching unit P1 and a second switching unit N1.

The first switching unit P1 is provided with a control terminal, a first terminal and a second terminal. The control terminal is electrically connected with the control unit C1 at a point A, the first terminal is electrically connected with a first power supply voltage Vpp, and the second terminal is electrically connected with the third input terminal PXID of the driving module.

The second switching unit N1 is provided with a control terminal, a first terminal and a second terminal. The control terminal is electrically connected with the control unit C1 at the point A, the first terminal is electrically connected with a second power supply voltage Vs1, and the second terminal is electrically connected with the third input terminal PXID of the driving module. The second power supply voltage is greater than a ground voltage Vss.

In the embodiment, the control unit C1 includes a first inverter A1 and a second inverter A2.

The first inverter A1 is provided with an input terminal and an output terminal, the input terminal of the first inverter A1 is configured to receive a third external driving signal, and the output terminal of the first inverter A1 is electrically connected with the control terminal of the first switching unit P1 and the control terminal of the second switching unit N1 at the point A.

The second inverter A2 is electrically connected with the first power supply voltage Vpp, and the second inverter A2 is provided with an input terminal and an output terminal. The input terminal of the second inverter A2 is electrically connected with the output terminal of the first inverter A1, and the output terminal of the second inverter A2 is electrically connected with the first terminal of the first switching unit P1. In this embodiment, the first terminal of the first switching unit P1 is electrically connected with the first power supply voltage Vpp through the second inverter A2.

When the word line driving circuit is in a standby mode, the third external driving signal provides a low potential, the input terminal of the first inverter A1 receives the third external driving signal, and a high potential is output by the output terminal of the first inverter, to control the first switching unit P1 to be turned off and the second switching unit N1 to be turned on. Therefore, the third input terminal PXID of the driving module receives the second power supply voltage Vs1.

When the word line driving circuit is in an active mode, the third external driving signal provides a high potential, the input terminal of the first inverter A1 receives the third external driving signal, and a low potential is output by the output terminal of the first inverter, to control the first switching unit P1 to be turned on and the second switching unit N1 to be turned off. Therefore, the third input terminal PXID of the driving module receives the first power supply voltage Vpp.

In addition, the first inverter A1 is formed by an odd number of sub-inverters connected in series, and the second inverter A2 is formed by an odd number of sub-inverters connected in series. For example, in this embodiment, the first inverter A1 is constituted of one sub-inverter, the second inverter A2 is constituted of one sub-inverter. In another embodiment, the first inverter A1 is constituted of three sub-inverters, and the second inverter A2 is constituted of three sub-inverters. The number of sub-inverters constituting the first inverter A1 may be the same as or different from the number of sub-inverters constituting the second inverter A2, which is not limited herein.

In addition, the first switching unit P1 is a first PMOS transistor, and the second switching unit N1 is a first NMOS transistor.

Moreover, the driving module includes a P-type driving transistor P, an N-type driving transistor N and a second NMOS transistor N2.

The P-type driving transistor P is provided with a control terminal, a first terminal and a second terminal. The control terminal is electrically connected with the first input terminal bMWL of the driving module, the first terminal is electrically connected with the third input terminal PXID of the driving module, and the second terminal is electrically connected with the output terminal WL of the driving module.

The N-type driving transistor N is provided with a control terminal, a first terminal and a second terminal. The control terminal is electrically connected with the first input terminal bMWL of the driving module, the first terminal is electrically connected with output terminal WL of the driving module, and the second terminal is electrically connected with a ground terminal Vss.

The second NMOS transistor N2 is provided with a control terminal, a first terminal and a second terminal. The first terminal is electrically connected with the output terminal WL of the driving module, and the second terminal is electrically connected with the ground terminal Vss.

In addition, in the second embodiment, the driving module further includes a third inverter A3. The third inverter A3 is electrically connected with the first power supply voltage Vpp to implement power supply. The third inverter A3 is provided with an input terminal and an output terminal, the input terminal of the third inverter A3 is electrically connected with the second input terminal PXIB of the driving module and is configured to receive the second external driving signal, and the output terminal of the third inverter A3 is electrically connected with the control terminal of the second NMOS transistor N2.

Moreover, the third inverter A3 is formed by an odd number of sub-inverters connected in series. For example, in this embodiment, the third inverter A3 is constituted of one sub-inverter. In another embodiment, the first inverter A3 is constituted of three sub-inverters. The number of the sub-inverters constituting the third inverter A3 may be set according to actual requirements, which is not limited herein.

When the word line driving circuit is in a standby mode, the first external driving signal provides a high potential, the P-type driving transistor P is turned off, and the N-type driving transistor N is turned on, to enable the output terminal WL to be electrically connected with the ground terminal Vss. The second external driving signal provides a low potential, the third inverter A3 outputs a high potential, and then the second NMOS transistor N2 is turned on, to enable the output terminal WL to be also electrically connected with the ground terminal Vss, then a word line driving signal with a low potential is output and the corresponding word line is closed. Meanwhile, the third external driving signal provides a low potential, the input terminal of the first inverter A1 receives the third external driving signal, and a high potential is output by the output terminal of the first inverter. Then, the first switching unit P1 is turned off, and the second switching unit N1 is turned on, to enable the third input terminal PXID of the driving module to receive the second power supply voltage Vs1. Since the second power supply voltage Vs1 is greater than the ground voltage Vss, the voltage difference between the gate and the source of the P-type driving transistor P is reduced, and the GIDL caused by the gate-source voltage difference of the P-type driving transistor P in the word line driving circuit can be reduced. Therefore, static power consumption of the P-type driving transistor P in the standby mode can be reduced, and service lives of the components in the circuit can be prolonged.

When the word line driving circuit is in an active mode, the first external driving signal provides a low potential, then the P-type driving transistor P is turned on, and the N-type driving transistor N is turned off, to enable the output terminal WL to be electrically connected with the first terminal of the P-type driving transistor P. The second external driving signal provides a high potential, the third inverter A3 outputs a low potential, and the second NMOS transistor N2 is turned off to prevent the output terminal WL from being electrically connected with the ground terminal Vss. Meanwhile, the third external driving signal provides a high potential, the input terminal of the first inverter A1 receives the third external driving signal, and a low potential is output by the output terminal, then the first switching unit P1 is controlled to be turned on, and the second switching unit N1 to be turned off, to enable the third input terminal PXID of the driving module to receive the first power supply voltage Vpp. Then the output terminal WL is electrically connected with the first power supply voltage Vpp, thus, a word line driving signal with a high potential is output. Therefore, the word line is driven, and normal operation of the word line driving circuit can be ensured.

In this embodiment, in the standby mode, since the first PMOS transistor P1 and the first NMOS transistor N1 are directly electrically connected with the output terminal A of the first inverter, in this mode, the point A is at a high potential. Then the first PMOS transistor P1 is turned off, and the first NMOS transistor N1 is turned on, which actually leads to an electrical isolation between the second inverter A2 and the P-type driving transistor P. The source voltage of the P-type driving transistor P is controlled by the first NMOS transistor N1, in other words, the potential of the PXID is controlled by the second power supply voltage Vs1, thus, the source voltage of the P-type driving transistor P is Vs1. When the source voltage of the P-type driving transistor P is greater than the output voltage Vss of the second inverter, that is, Vs1 is greater than Vss, the gate-source voltage difference of the P-type driving transistor P in this solution is reduced compared with the solution in some implementations. Therefore, the GIDL caused by the gate-source voltage difference of the P-type driving transistor P in the word line driving circuit of the dynamic random access memory can be reduced, and the static power consumption of the P-type driving transistor P in the standby mode can be reduced, further, the service lives of the components in the circuit can be prolonged.

Figure 4:
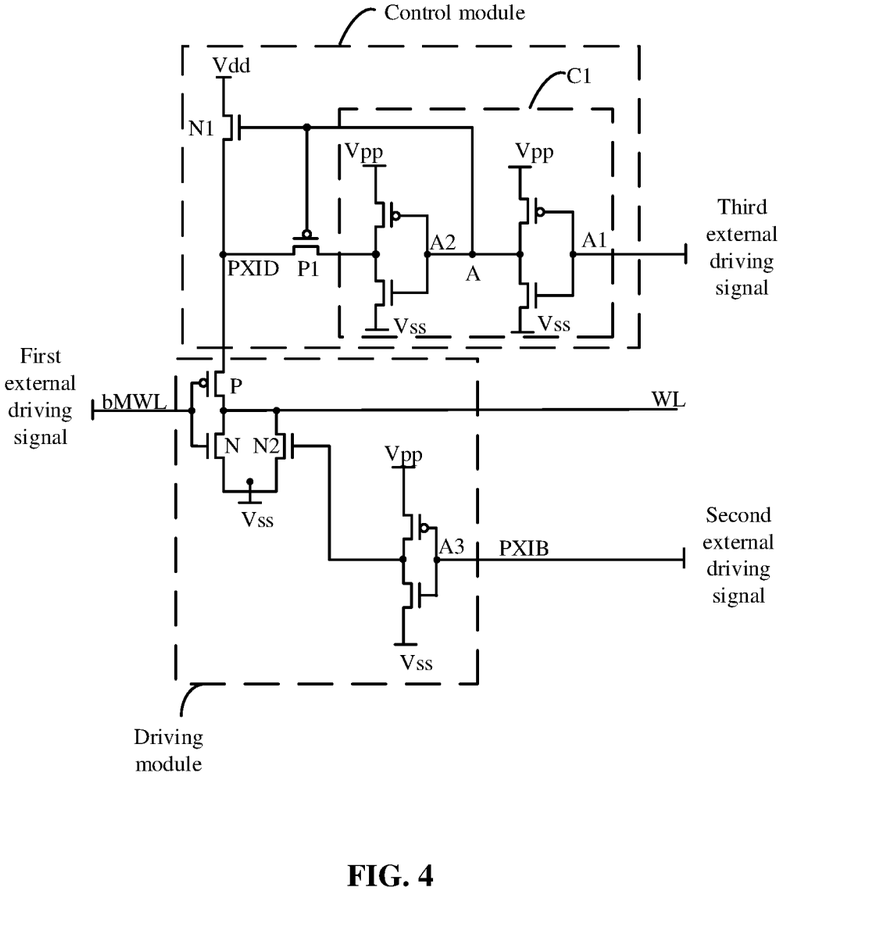
FIG. 4 illustrates a circuit diagram of a word line driving circuit according to a third embodiment of the present disclosure.

The third embodiment of the present disclosure also provides a word line driving circuit. The difference between the third embodiment and the second embodiment is that the second power supply voltages in these embodiments are different from each other. Reference is made to FIG. 4, FIG. 4 illustrates a circuit diagram of a word line driving circuit according to a third embodiment of the present disclosure.

The word line driving circuit includes a driving module and a control module.

The driving module is provided with a first input terminal bMWL, a second input terminal PXIB, a third input terminal PXID and an output terminal WL. The first input terminal bMWL is configured to receive a first external driving signal, the second input terminal PXIB is configured to receive a second external driving signal, and the output terminal WL is configured to output a word line driving signal.

The control module includes a control unit C1, a first switching unit P1 and a second switching unit N1.

The first switching unit P1 is provided with a control terminal, a first terminal and a second terminal. The control terminal is electrically connected with the control unit C1 at a point A, the first terminal is electrically connected with a first power supply voltage Vpp, and the second terminal electrically connected with the third input terminal PXID of the driving module.

The second switching unit N1 is provided with a control terminal, a first terminal and a second terminal. The control terminal is electrically connected with the control unit C1 at the point A, the first terminal is electrically connected with a second power supply voltage Vdd, and the second terminal is electrically connected with the third input terminal PXID of the driving module. The second power supply voltage Vdd is greater than a ground voltage Vss.

In the third embodiment, the second power supply voltage Vdd is a chip power supply voltage. In addition, in this embodiment, the first power supply voltage Vpp is greater than the second power supply voltage Vdd.

When the word line driving circuit is in a standby mode, the control unit C1 receives a third external driving signal and controls the first switching unit P1 to be turned off and the second switching unit N1 to be turned on according to the third external signal, to enable the third input terminal PXID of the driving module to receive the second power supply voltage Vdd.

When the word line driving circuit is in an active mode, the control unit C1 receives a third external driving signal and controls the first switching unit P1 to be turned on and the second switching unit N1 to be turned off according to the third external signal, to enable the third input terminal PXID of the driving module to receive the first power supply voltage Vpp.

In this embodiment, when the word line driving circuit is in the standby mode, the third input terminal of the driving module is electrically connected with the second power supply voltage Vdd, and the second power supply voltage Vdd is greater than the ground voltage Vss, then the voltage of the third input terminal of the driving module is pulled up. Compared with the solution in some implementations, the gate-source voltage difference of the P-type driving transistor P in the present solution is reduced, and the GIDL caused by the gate-source voltage difference of the P-type driving transistor P in the word line driving circuit of the dynamic random access memory can be reduced. Therefore, the static power consumption of the P-type driving transistor P in the standby mode can be reduced, and the service lives of the components in the circuit can be prolonged.

The present disclosure also provides a dynamic driving memory including a word line and the above word line driving circuit. An output terminal WL of the word line driving circuit is electrically connected with the word line, to drive the word line. When the word line driving circuit is in a standby mode, the word line is not driven, and when the word line driving circuit is in an active mode, the word line is driven to be in an operating state.

The above are merely preferred embodiments of the present disclosure, and it should be noted that, for those of ordinary skill in the art, several improvements and embellishments may be made without departing from the principles of the present disclosure, and such improvements and finishes should also be regarded as falling within the protection scope of the present disclosure.

What is claimed is:

1. A word line driving circuit, comprising:
   a driving circuit provided with a first input terminal, a second input terminal, a third input terminal and an output terminal, wherein the first input terminal is configured to receive a first external driving signal, the second input terminal is configured to receive a second external driving signal, and the output terminal is configured to output a word line driving signal; and
   a control circuit, comprising:
      a control sub-circuit;
      a first switching sub-circuit provided with a control terminal, a first terminal and a second terminal, wherein the control terminal of the first switching sub-circuit is electrically connected with the control sub-circuit, the first terminal of the first switching sub-circuit is electrically connected with a first power supply voltage, and the second terminal of the first switching sub-circuit is electrically connected with the third input terminal of the driving circuit; and
      a second switching sub-circuit provided with a control terminal, a first terminal and a second terminal, wherein the control terminal of the second switching sub-circuit is electrically connected with the control sub-circuit, the first terminal of the second switching sub-circuit is electrically connected with a second power supply voltage, the second terminal of the second switching sub-circuit is electrically connected with the third input terminal of the driving circuit, and the second power supply voltage is greater than a ground voltage.

2. The word line driving circuit of claim 1, wherein in response to the word line driving circuit being in a standby mode, the control sub-circuit is configured to control the first switching sub-circuit to be turned off and the second switching sub-circuit to be turned on, to enable the third input terminal of the driving circuit to receive the second power supply voltage.

3. The word line driving circuit of claim 1, wherein in response to the word line driving circuit being in an active mode, the control sub-circuit is configured to control the first switching sub-circuit to be turned on and the second switching sub-circuit to be turned off, to enable the third input terminal of the driving circuit to receive the first power supply voltage.

4. The word line driving circuit of claim 1, wherein the control sub-circuit is electrically connected with the first power supply voltage, and the first terminal of the first switching sub-circuit is electrically connected with the first power supply voltage through the control sub-circuit.

5. The word line driving circuit of claim 4, wherein the control sub-circuit comprises:
   a first inverter provided with an input terminal and an output terminal, wherein the input terminal of the first inverter is configured to receive a third external driving signal, and the output terminal of the first inverter is electrically connected with the control terminal of the first switching sub-circuit and the control terminal of the second switching sub-circuit; and
   a second inverter electrically connected with the first power supply voltage and provided with an input terminal and an output terminal, wherein the input terminal of the second inverter is electrically connected with the output terminal of the first inverter, and the output terminal of the second inverter is electrically connected with the first terminal of the first switching sub-circuit.

6. The word line driving circuit of claim 5, wherein in response to the word line driving circuit being in a standby mode, the third external driving signal provides a low potential, the first switching sub-circuit is turned off, and the second switching sub-circuit is turned on, to enable the third input terminal of the driving circuit to receive the second power supply voltage.

7. The word line driving circuit of claim 5, wherein in response to the word line driving circuit being in an active mode, the third external driving signal provides a high potential, the first switching sub-circuit is turned on, and the second switching sub-circuit is turned off, to enable the third input terminal of the driving circuit to receive the first power supply voltage.

8. The word line driving circuit of claim 5, wherein the first inverter is formed by an odd number of sub-inverters connected in series, and/or the second inverter is formed by an odd number of sub-inverters connected in series.

9. The word line driving circuit of claim 1, wherein the first switching sub-circuit is a first P-type Metal-Oxide-Semiconductor (PMOS) transistor and the second switching sub-circuit is a first N-type Metal-Oxide-Semiconductor (NMOS) transistor.

10. The word line driving circuit of claim 1, wherein the second power supply voltage is a chip power supply voltage.

11. The word line driving circuit of claim 1, wherein the second power supply voltage is a source power supply voltage.

12. The word line driving circuit of claim 1, wherein the second power supply voltage is less than a threshold voltage of the second switching sub-circuit.

13. The word line driving circuit of claim 1, wherein the first power supply voltage is greater than the second power supply voltage.

14. The word line driving circuit of claim 1, wherein the driving circuit comprises:
   a P-type driving transistor provided with a control terminal, a first terminal and a second terminal, wherein the control terminal of the P-type driving transistor is electrically connected with the first input terminal of the driving circuit, the first terminal of the P-type driving transistor is electrically connected with the third input terminal of the driving circuit, and the second terminal of the P-type driving transistor is electrically connected with the output terminal of the driving circuit;
   an N-type driving transistor provided with a control terminal, a first terminal and a second terminal, wherein the control terminal of the N-type driving transistor is electrically connected with the first input terminal of the driving circuit, the first terminal of the N-type driving transistor is electrically connected with the output terminal of the driving circuit, and the second terminal of the N-type driving transistor is electrically connected with a ground terminal; and
   a second NMOS transistor provided with a control terminal, a first terminal and a second terminal, wherein the control terminal of the second NMOS transistor is electrically connected with the second input terminal of the driving circuit, the first terminal of the second NMOS transistor is electrically connected with the output terminal of the driving circuit, and the second terminal of the second NMOS transistor is electrically connected with the ground terminal.

15. The word line driving circuit of claim 14, wherein in response to the word line driving circuit being in a standby mode, the first external driving signal provides a high potential, and the second external driving signal provides a high potential.

16. The word line driving circuit of claim 14, wherein in response to the word line driving circuit being in an active mode, the first external driving signal provides a low potential, and the second external driving signal provides a low potential.

17. The word line driving circuit of claim 14, wherein the driving circuit further comprises a third inverter, wherein the third inverter is provided with an input terminal and an output terminal, the input terminal of the third inverter is electrically connected with the second input terminal of the driving circuit and is configured to receive the second external driving signal, and the output terminal of the third inverter is electrically connected with the control terminal of the second NMOS transistor.

18. The word line driving circuit of claim 17, wherein in response to the word line driving circuit being in a standby mode, the first external driving signal provides a high potential and the second external driving signal provides a low potential.

19. The word line driving circuit of claim 17, wherein in response to the word line driving circuit being in an active mode, the first external driving signal provides a low potential and the second external driving signal provides a high potential.

20. A dynamic random access memory comprising the word line driving circuit of claim 1.

\* \* \* \* \*